United States Patent [19]

Agiman

[11] Patent Number: 5,528,192
[45] Date of Patent: Jun. 18, 1996

[54] BI-MODE CIRCUIT FOR DRIVING AN OUTPUT LOAD

[75] Inventor: Dan Agiman, Rosh Haain, Israel

[73] Assignee: Linfinity Microelectronics, Inc., Garden Grove, Calif.

[21] Appl. No.: 151,363

[22] Filed: Nov. 12, 1993

[51] Int. Cl.$^6$ ........................ H03K 17/615; H03K 17/00
[52] U.S. Cl. ............................ 327/374; 327/87; 327/111; 327/483; 327/377; 326/17
[58] Field of Search ...................... 307/270, 255, 307/246, 355, 359, 253, 254, 542, 572, 358; 326/31, 93, 17

[56] References Cited

U.S. PATENT DOCUMENTS

| | | | |
|---|---|---|---|
| 4,480,201 | 10/1984 | Jaeschke | 307/220 |
| 4,885,486 | 12/1989 | Shekhawat et al. | 327/377 |
| 4,948,991 | 8/1990 | Shucker et al. | 307/455 |
| 5,087,834 | 2/1992 | Tsay | 302/359 |
| 5,124,577 | 6/1992 | Davis et al. | 307/359 |
| 5,148,056 | 9/1992 | Glass et al. | 302/522 |
| 5,289,051 | 2/1994 | Zitta | 327/387 |

*Primary Examiner*—Timothy P. Callahan
*Assistant Examiner*—Dinh T. Le
*Attorney, Agent, or Firm*—Loeb & Loeb

[57] ABSTRACT

A bi-mode circuit for driving an output load selectively couples the output load to a supply voltage source or to a low discharge voltage source such as ground using switches which are controlled by an input buffer in response to an input signal. A high input signal closes a first switch to provide a biasing current to first and second current amplifiers to turn on a first output transistor which couples the output load to the low reference voltage to discharge the output load. Conversely, a low input signal closes a second switch to provide the biasing current to a third current amplifier to turn on a second output transistor which couples the output load to the supply voltage source. When the input signal becomes high, rapid pulldown of a capacitive output load is achieved using a high internal pre-drive current provided by the first and second current amplifiers, in a first mode of operation. As the output voltage decreases, turnoff of the first output transistor is prevented by switching to a second mode when the output voltage drops below a threshold value as determined by a comparator. The comparator effectively closes a third switch and thereby a loop which bypasses the first current amplifier to prevent the drive current from escaping the first current amplifier, so that the second current amplifier continues to amplify the biasing current to maintain the first output transistor on.

35 Claims, 3 Drawing Sheets

BI-MODE CIRCUIT FOR DRIVING AN OUTPUT LOAD

BACKGROUND OF THE INVENTION

1. Field of the Invention

The present invention relates to circuits for driving an output load, and more particularly to drive circuits capable of achieving rapid pulldown or discharge of an output load while minimizing the output current and voltage.

2. History of the Prior Art

It is known to provide circuits for driving an output load in response to an input signal. In the case of a capacitive output load, circuits are known which pull down or discharge the capacitive output load in response to an input signal of predetermined level. Desirably, such circuits are capable of driving large amounts of current at the output load while maintaining low output voltage and low drive current. An example of a capacitive output load with which such circuits are used comprises the gate of a power MOSFET which is external to but used in conjunction with an integrated circuit.

Circuits for driving an output load in high current fashion while at the same time attempting to maintain a low output voltage and low drive current have assumed a number of different forms. One such circuit utilizes constant drive. Such circuits tend to be temperature-limited as well as subject to process variations. On the other hand, the use of a Darlington configuration provides ample current drive but suffers the disadvantage of high output voltage.

Therefore, it would be advantageous to provide a driving circuit for an output load which provides pulldown or discharge of the output load in an effective manner and without suffering from the disadvantages of high output voltage or high drive current.

BRIEF DESCRIPTION OF THE INVENTION

Briefly stated, the present invention provides a drive circuit for driving an output load, which drive circuit is capable of driving large amounts of current while maintaining low output voltage and low drive current. When used with a capacitive output load, such circuits provide an effective capacitive discharge arrangement which does not suffer from the disadvantages of high output voltage and high drive current. Such arrangements provide for reduced discharge time or fall time of the capacitive load.

In drive circuits according to the invention, the output load is selectively coupled to be charged by a supply voltage source or to discharge to a low voltage source such as ground, through a pair of output transistors which are alternately rendered conductive and non-conductive by a switching arrangement for controlling the application of biasing current in response to an input buffer coupled to receive an input signal. When the input signal is high, the switching arrangement couples the biasing current to first and second current amplifiers to turn on a first one of the pair of output transistors and thereby couple the output load to ground. Conversely, when the input signal is low, the switching arrangement couples the biasing current to a third current amplifier to turn on a second one of the pair of output transistors and thereby couple the supply voltage source to the output load.

When the input signal is high so as to apply the biasing current to the first and second current amplifiers, the first current amplifier is biased by the output voltage at the output load so as to amplify the biasing current and apply such current to the second current amplifier for further amplification, in a first mode of operation. However, when the output voltage drops below a reference or threshold value, a comparator responds by closing a switch and thereby a circuit path which bypasses the first current amplifier. This has the effect of preventing the drive current within the first current amplifier from escaping, so as to thereby effectively apply the biasing current to the second current amplifier to keep the first of the pair of output transistors turned on.

BRIEF DESCRIPTION OF THE DRAWINGS

A better understanding of the invention may be had by reference to the following detailed description taken in conjunction with the accompanying drawings, in which.

DETAILED DESCRIPTION

Figure 1:
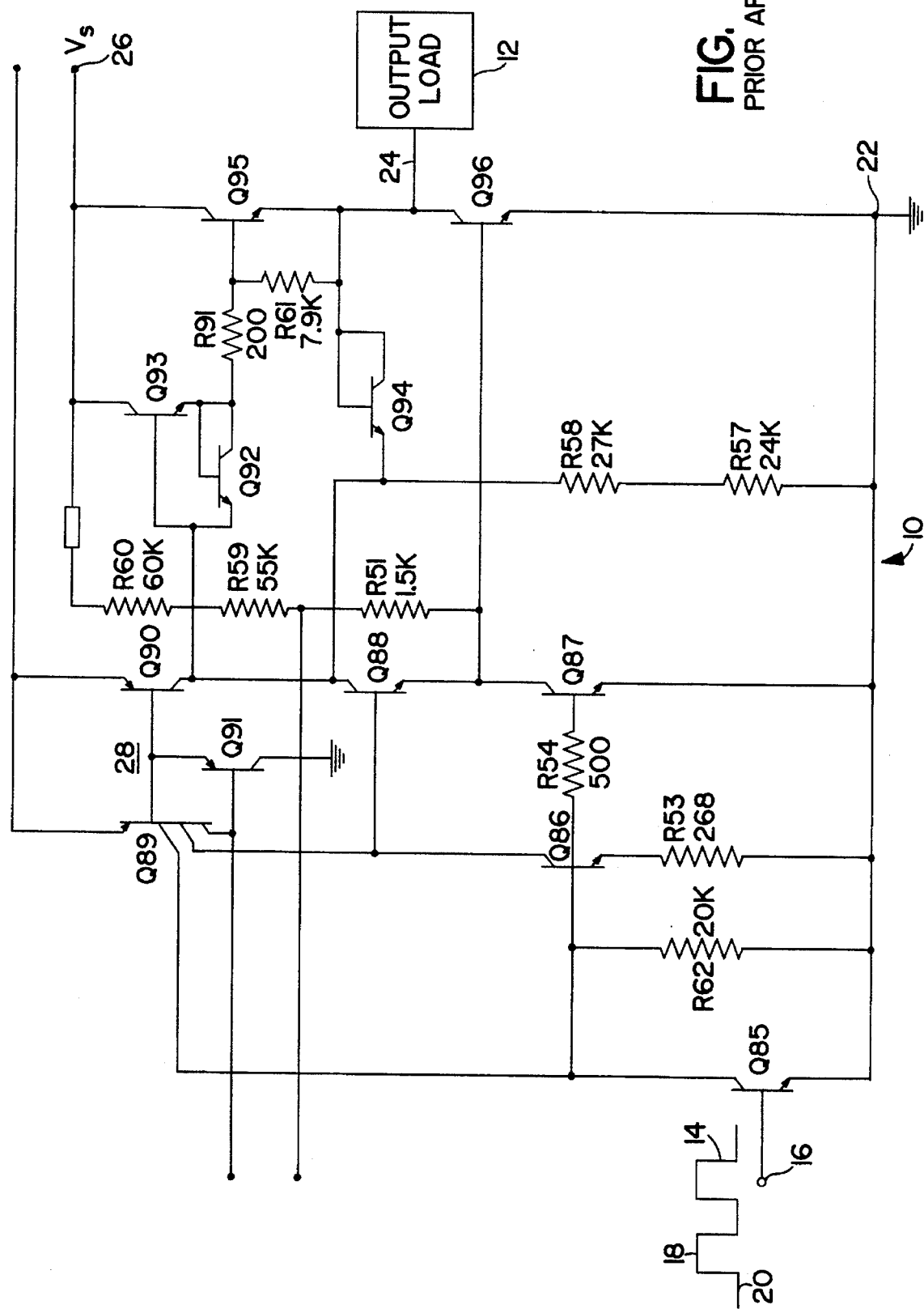
FIG. 1 is a schematic circuit diagram of a prior art driving circuit.

FIG. 1 provides an example of a prior art circuit 10 for driving an output load 12 in response to an input signal 14 applied at a terminal 16. The input signal 14 is bi-level in nature, so as to assume either a high level 18 or a low level 20.

As described hereafter, the circuit 10 of FIG. 1 responds to the high level 18 of the input signal 14 by turning on a first one Q96 of a pair of output transistors Q95 and Q96 to couple the output load 12 to a low voltage source at a terminal 22. In the example of FIG. 1, the terminal 22 is grounded. The output load 12 is of the capacitive type, so that turning on the first output transistor Q96 pulls down an output 24, comprised of the coupling of the circuit 10 to the load 12, by coupling the output 24 to the grounded terminal 22. However, it should be understood that circuits of this type including those according to the invention as described hereafter can be used with other types of output loads, such as resistive or inductive loads, for example. Ideally, the circuit 10 of FIG. 1 should have a relatively short fall time, so that the output 24 at the load 12 is pulled down to a low voltage as quickly as possible.

When the input signal 14 is at the low level 20, the transistor Q96 is turned off, and the second one Q95 of the pair of output transistors Q95 and Q96 is turned on. This couples the output 24 to a high voltage source in the form of a supply voltage $V_s$ applied to a terminal 26.

Transistors Q89 and Q90 form a source of biasing current 28 for the circuit 10 of FIG. 1. When the high level 18 of the input signal 14 is applied to the terminal 16 which is coupled to the base terminal of a transistor Q85, the transistor Q85 is turned on. This turns off transistors Q86 and Q87. The drive from one of the collectors of the transistor Q89 within the biasing current source 28 turns on a transistor Q88, and this changes the bias at the base terminal of the first output transistor Q96 to turn on the transistor Q96. When the transistor Q88 is turned on, a transistor Q93 is prevented from turning on, and this in turn prevents the second output transistor Q95 from turning on.

Conversely, when the low level 20 of the input signal 14 appears at the terminal 16 and is applied to the base terminal of the transistor Q85, the transistor Q85 is turned off. The collector drive from the transistor Q89 turns on the transistors Q86 and Q87. With the transistor Q87 turned on, the first output transistor Q96 is turned off. The transistor Q86 turns off the transistor Q88, so that the collector of the transistor Q90 turns on the transistor Q93, and this turns on the second output transistor Q95 to couple the output load 12 to the supply voltage $V_s$ at the terminal 26. Consequently, the voltage at the output 24 is at a high level.

The fall time of the circuit 10 is a function of the capacitive load comprising the output load 12 and the drive capability of the first output transistor Q96. The drive capability of the output transistor Q96 is partly a function of the drive current from the collector of the transistor Q90 within the biasing current source 28 and the drive current to the base of the transistor Q88. This drive current cannot be too large, if the circuit 10 is to remain effective. However, this places a constraint on the fall time performance of the circuit 10. The addition of a transistor, coupled in Darlington circuit fashion, will solve the drive problem, but at the expense of a high output voltage.

Figure 2:
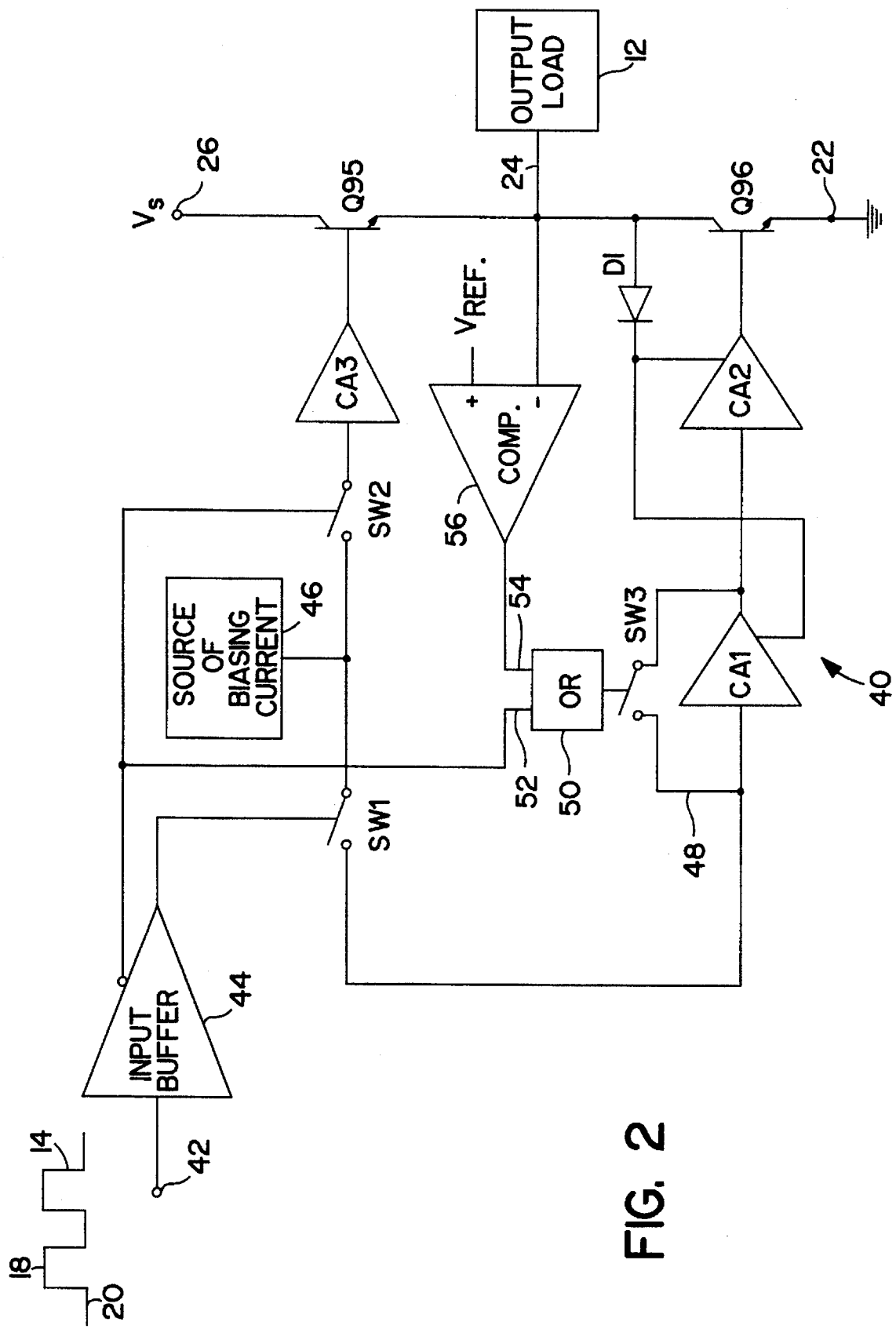
FIG. 2 is a block diagram of a bi-mode circuit for driving an output load in accordance with the invention.
Figure 3:
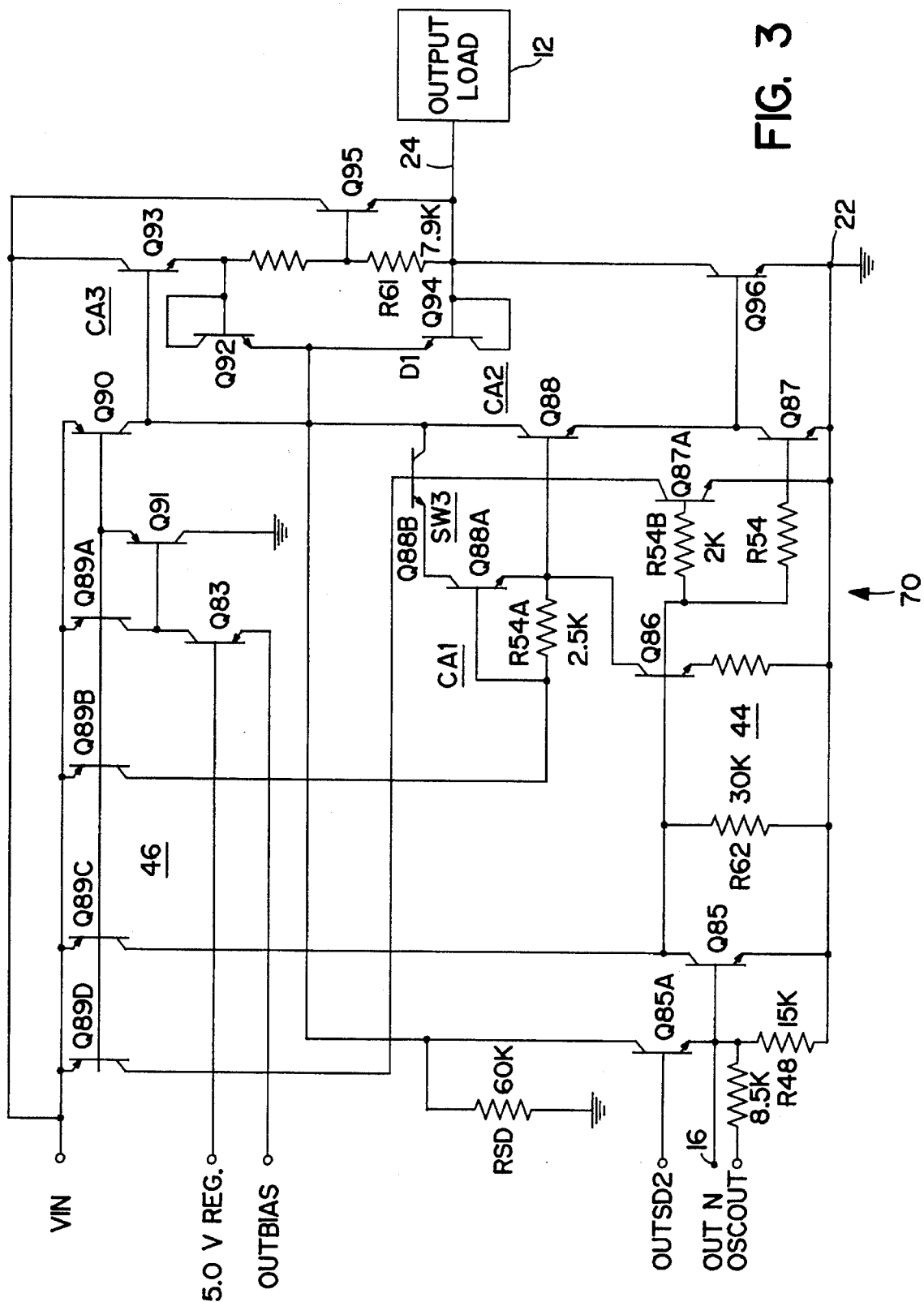
FIG. 3 is a schematic circuit diagram of a detailed example of the bi-mode circuit of FIG. 2.

In accordance with the invention, and as described hereafter in connection with FIGS. 2 and 3, the above-noted problems are solved by utilizing a two-stage switchable boost drive. This drives the output in the manner of a Darlington circuit, but switches to a single transistor drive configuration when the output voltage drops below some predetermined level. Accordingly, such circuit operates in bi-mode fashion in response to the output voltage.

FIG. 2 is a block diagram of a bi-mode circuit 40 in accordance with the invention. In the circuit 40, the input signal 14 is applied to a terminal 42 of an input buffer 44. The circuit 40 of FIG. 2 also has the pair of output transistors Q96 and Q95, which are respectively coupled between the output 24 and the grounded terminal 22 and between the output 24 and the terminal 26 for receiving the supply voltage $V_s$. The circuit 40 also includes a source of biasing current 46.

The circuit 40 of FIG. 2 includes a pair of switches SW1 and SW2. When the input signal 14 is at the high level 18, the input buffer 44 responds by closing the switch SW1 and opening the switch SW2. This couples the source of biasing current 46 to a first current amplifier CA1. The first current amplifier CA1 amplifies the biasing current before applying it to a second current amplifier CA2. The second current amplifier CA2 further amplifies the biasing current before applying it to the base terminal of the first output transistor Q96. In this fashion, the first output transistor Q96 is turned on in response to the input signal 14 assuming the high level 18.

Conversely, when the input signal 14 assumes the low level 20, the input buffer 44 responds by closing the switch SW2 and opening the switch SW1. This couples the source of biasing current 46 to a third current amplifier CA3. The third current amplifier CA3 amplifies the biasing current and applies it to the base of the second output transistor Q95, to turn on the transistor Q95 and couple the output 24 to the supply voltage $V_s$.

In accordance with the invention, the circuit 40 of FIG. 2 includes a third switch SW3 for selectively opening or closing a shunt path 48 which bypasses the first current amplifier CA1 by coupling the input thereof directly to the output thereof. The switch SW3 is coupled to be operated by an OR gate 50 having a first input 52 coupled to an output of the input buffer 44 and a second input 54 coupled to the output of a comparator 56. The comparator 56 compares the output voltage at the output 24 with a reference voltage $V_{REF}$ defining a threshold voltage for the bi-mode operation of the circuit. A diode D1 couples the first current amplifier CA1 and the second current amplifier CA2 to be biased as a result of the voltage at the output 24.

As previously noted, when the input signal 14 is at the high level 18, the input buffer 44 closes the switch SW1 to apply the biasing current from the source 46 to the first current amplifier CA1. The first current amplifier CA1 amplifies the biasing current before applying it to the second current amplifier CA2. The second current amplifier CA2 amplifies the biasing current further, before applying it to the base of the first output transistor Q96 to turn on the transistor Q96. This pulls down the output 24 to discharge the capacitive load comprised by the output load 12. As such, the circuit 40 is operating in the first of its two different modes. The diode D1 has the effect of biasing the first current amplifier CA1 in response to the output voltage at the output 24.

Without some compensating means, the falling voltage at the output 24 would eventually reach a level that would no longer allow the diode D1 to bias the first current amplifier CA1. Alternatively, a circuit configuration could be used which would maintain high internal pre-drive current, but at the expense of a high output voltage.

In the circuit 40 of FIG. 2, the comparator 56 responds to a decrease in the voltage at the output 24 below the reference or threshold value $V_{REF}$ by closing the switch SW3. This has the effect of applying the biasing current from the source 46 directly to the second current amplifier CA2, to maintain the first output transistor Q96 turned on. Closure of the shunt path 48 by the switch SW3, prevents drive within the first current amplifier CA1 from escaping. Instead, such drive current is applied to the second current amplifier CA2. The second current amplifier CA2 amplifies such drive current and applies it to the base terminal of the first output transistor Q96 to maintain the transistor Q96 turned on.

Again, when the input signal 14 falls to the low level 20, the input buffer 44 responds by closing the switch SW2 to apply the biasing current to the third current amplifier CA3 for amplification and application of such current to the base of the second output transistor Q95. This turns on the transistor Q95 to couple the voltage source $V_s$ to the output 24. When this occurs, switch SW1 prevents biasing of the current amplifiers CA1 and CA2, so that the first output transistor Q96 remains off when the second output transistor Q95 is on.

FIG. 3 is a schematic diagram of a circuit 70 which comprises a detailed example of the circuit 40 of FIG. 2. The circuit 70 of FIG. 3 has certain similarities to the prior art circuit 10 of FIG. 1, and like components are therefore similarly labeled. The input buffer 44 of the circuit 40 of FIG. 2 is comprised of the transistors Q85 and Q86, plus an additional transistor Q87A and a resistor R54B. The transistor Q85 has a collector terminal coupled to a base terminal of the transistor Q86, and to a base terminal of the added transistor Q87A through the resistor R54B. Also, a transistor Q85A is added, to provide under voltage shutdown. As in the case of FIG. 1, the transistor Q85 has the base terminal thereof coupled to an input terminal 16 to receive the input signal 14 (not shown in FIG. 3).

The circuit 10 of FIG. 2 includes the biasing current source 46. In the circuit 10 of FIG. 1, the biasing current source 28 thereof is comprised of the transistors Q89 and Q90. In the circuit 70 of FIG. 3, the biasing current source 46 includes the transistor Q90. In addition, the source 46 includes transistors Q89A, Q89B, Q89C and Q89D. The transistor Q89A is coupled to the transistors Q83 and Q91. The transistor Q89C is coupled to the transistor Q85. The collector of the transistor Q89B is coupled to provide biasing current to the first current amplifier CA1 which is comprised of a transistor Q88A having a resistor R54A coupled between the base and emitter terminals thereof. A collector terminal of the transistor Q88A is coupled to the emitter terminal of a transistor Q88B comprising the switch SW3. The transistor Q88B has a base terminal coupled to the collector terminal of the transistor Q89D, within the source of biasing current 46, as well as to the collector terminal of the transistor Q87A within the input buffer 44.

With the circuit 70 of FIG. 3 thus constituted and connected, the transistor Q94 comprises the diode D1 of FIG. 2. The transistor Q88 comprises the second current amplifier CA2, while the transistor Q93 comprises the third current amplifier CA3.

If it is assumed that the first output transistor Q96 has a limited output drive capability, then the fall time (90% to 10% of full voltage swing of the output 24) is a function of the capacitive output load 12. The larger the capacitive load 12, the longer it takes for a given current to discharge the load 12. To achieve a relatively short fall time, a large output drive capability is required. Such large output drive capability necessitates a large internal pre-drive current. However, such a large internal pre-drive current is wasteful. To avoid this, the circuit 70 of FIG. 3 employs a Darlington type circuit of pre-drive configuration. In the first mode, the transistor Q88B, which comprises the switch SW3, connects the collector of the transistor Q88A within the first current amplifier CA1 to the collector of the transistor Q88 within the second current amplifier CA2. This forms a Darlington pair of transistors Q88A and Q88.

A Darlington transistor configuration suffers from a high $V_{SAT}$ voltage. This is the voltage between the collector terminal and the emitter terminal of the transistor Q88, in the circuit 70 of FIG. 3.

To compensate for this, the bi-mode switching action is employed. Namely, when the output voltage at the collector terminal of the first output transistor Q96 drops below the threshold value ($V_{REF}$), the current in the switch SW3 (transistor Q88B) is changing polarity and is limited in value. Current begins to flow out of the collector terminal of the transistor Q88A instead of into the collector terminal thereof. The transistor Q88B, which comprises the switch SW3, is drive limited in the reverse conduction mode and prevents most of the drive current from escaping the collector terminal of the transistor Q88A. Consequently, most of the current reaching the base terminal of the transistor Q88A is also applied to the base terminal of the transistor Q88. Part of the current is also applied to the base terminal of the transistor Q88 via the resistor R54A.

Normally, when the output voltage drops below $V_{BE}$+ $V_{SAT}$ in a Darlington circuit, the drive current does not reach the base terminal of the main transistor. However, in the circuit 70 of FIG. 3, the transistor Q88, comprising the second current amplifier CA2, continues to function in single transistor fashion, due to the action of the transistor Q88A and the resistor R54A of the first current amplifier CA1 and the transistor Q88B of the switch SW3.

When the high level 18 of the input signal 14 is present at the terminal 16, at the base terminal of the transistor Q85, the transistor Q85 is turned on. This turns off the transistor Q86 and the transistors Q87 and Q87A. Drive current from the transistor Q89B within the biasing current source 46 turns on the transistor Q88A, and this turns on the transistor Q88. The transistor Q89D within the source 46 of biasing current turns on the transistor Q88B. This forces drive current from the collector terminal of the transistor Q90 and from the output through the transistor Q94 to the collector terminal of the transistor Q88A. This drive current is provided to the base terminal of the transistor Q88. In addition, the collector terminal of the transistor Q88 receives drive current from the collector terminal of the transistor Q90 and from the output through the transistor Q94. The transistor Q88 receives considerable drive current from the transistor Q88A, and both function as a Darlington transistor pairs. The transistor Q88 is on and prevents the transistors Q93 and Q95 from turning on. The output transistor Q96 receives a large amount of drive current from the transistor Q88.

The large amount of current applied to the output transistor Q96 is much larger than the drive current supplied by the prior art circuit 10 of FIG. 1. The output transistor Q96 is turned on, and the output 24 is at a low voltage level. A low voltage at the base terminal of the transistor Q85 turns off the transistor Q85. Current from the collector terminal of the transistor Q89C turns on the transistors Q86, Q87 and Q87A. The transistor Q86 turns off the transistor Q88 by diverting current from the base terminal of the transistor Q88. The transistor Q87 turns off the first output transistor Q96 by pulling its base terminal to ground potential. With the transistors Q88 and Q96 turned off, the collector of the transistor Q90 drives the transistor Q93 and consequently the second output transistor Q95. When this occurs, the output is in a high state. The transistors Q87A, Q88B and Q89D are needed to assure turnoff of the transistor Q88.

While the invention has been particularly shown and described with reference to a preferred embodiment thereof, it will be understood by those skilled in the art that various changes in form and details may be made therein without departing from the spirit and scope of the invention.

What is claimed is:

1. Apparatus for driving an output load in response to an input signal and in reference to a low voltage source, comprising:

a transistor coupled between the output load and the low voltage source, wherein the transistor couples the output load to a low voltage source to pull down the output load when biased by a current;

means for biasing the transistor into conduction under the control of the input signal comprises means providing a biasing current, a first current amplifier for amplifying the biasing current, and a second current amplifier for amplifying the biasing current from the first amplifier and applying it to the transistor; and means responsive to the voltage at the output load for bypassing the first current amplifier and amplifying the biasing current with the second current amplifier to the exclusion of the first current amplifier when the voltage at the output load falls below a predetermined level.

2. Apparatus for driving an output load comprising the combination of:

an output load having a voltage;

means for coupling the output load to a low voltage, when biased by a current, to pull down the output load;

means providing a biasing current;

first and second current amplifiers, the first current amplifier coupled to the means providing a biasing current for amplifying the biasing current, the second current amplifier providing said current to the means for coupling the output load to a low voltage when biased by the output load, and the first current amplifier providing said amplified biasing current to the second current amplifier when biased by the output load;

means for comparing the voltage of the output load with a threshold value; and means responsive to the means for comparing for bypassing the first current amplifier when the voltage of the output load is below the threshold value.

3. The apparatus in accordance with claim 2, wherein the means responsive to the means for comparing for bypassing comprises a transistor switch.

4. The apparatus in accordance with claim 3, wherein the first current amplifier comprises a first transistor coupled to the transistor switch and the second current amplifier comprises a second transistor coupled to provide said current to the means for coupling the output load to a low reference voltage when biased into conduction at a base thereof, the first transistor being coupled to provide said biasing current to the base of the second transistor when biased into conduction.

5. The apparatus in accordance with claim 4, wherein the second transistor has an emitter coupled to the means for coupling the output load to a low voltage and a collector coupled to the transistor switch and to the output load, and the first transistor has an emitter coupled to the base of the second transistor and a collector coupled to the transistor switch.

6. The apparatus in accordance with claim 5, wherein the transistor switch comprises a third transistor having an emitter coupled to the collector of the first transistor and a collector coupled to the collector of the second transistor.

7. Apparatus for driving an output load in response to an input signal, comprising the combination of:

means providing a biasing current;

a first current amplifier;

an input stage which is responsive to the input signal for applying the biasing current to the first current amplifier when the input signal has a high value, the first current amplifier being biased by a voltage at the output load to amplify the biasing current except when the voltage at the output load is less than a reference voltage;

a second current amplifier coupled to the first current amplifier and operative to amplify said biasing current amplified by the first current amplifier;

a first transistor coupled between the output load and a low voltage source and coupled to be biased by biasing current amplified by the second current amplifier;

means for comparing the voltage at the output load with the reference voltage; and a control stage which is responsive to the means for comparing for biasing the second current amplifier to the exclusion of the first current amplifier to amplify the biasing current whenever the voltage at the output load becomes less than the reference voltage.

8. The apparatus in accordance with claim 7, wherein the control stage comprises first switching means for coupling an output of the first current amplifier to an input of the first current amplifier to maintain a drive current therein whenever the voltage at the output load becomes less than the reference voltage.

9. The apparatus in accordance with claim 8, wherein the input stage comprises;

second switching means coupled between the means providing a biasing current and the first current amplifier; and an input buffer responsive to the input signal to close the second switching means and couple the means providing a biasing current to the first current amplifier when the input signal has a high value.

10. The apparatus in accordance with claim 9, further including:

a supply voltage source;

a second transistor coupled between the supply voltage source and the output load;

a third current amplifier coupled to the second transistor; and third switching means coupled between the means providing a biasing current and the third current amplifier, the input buffer being responsive to the input signal to close the third switching means and couple the means providing a biasing current to the third current amplifier when the input signal has a low value, the third current amplifier providing amplified biasing current to the second transistor.

11. The apparatus in accordance with claim 10, further including an OR circuit coupling the input buffer means and the means for comparing to the first switching means.

12. Apparatus for driving a capacitive output load, comprising the combination of:

a capacitive output load;

discharge means coupled to discharge the capacitive output load in response to an amplified biasing current;

first and second series connected current amplifiers coupled to provide the amplified biasing current to the discharge means in response to a biasing current at an input of the first current amplifier; and means coupled between said capacitive output load and said first current amplifier for bypassing the first current amplifier for providing the biasing current to the input of the second current amplifier when a voltage at the capacitive output load falls below a reference value.

13. The apparatus in accordance with claim 12, further comprising a supply voltage source, and means responsive to the input signal for coupling the supply voltage source to the capacitive output load when the input signal is at a second value.

14. The apparatus in accordance with claim 12, wherein the means for bypassing comprises means for comparing the voltage at the capacitive output load with the reference value, and switch means responsive to the means for comparing for providing a current bypass path around the first current amplifier to provide the biasing current to the second current amplifier when the voltage at the capacitive output load falls below the reference value.

15. Apparatus for driving a capacitive output load, comprising the combination of:

a capacitive output load;

discharge means coupled to discharge the capacitive output load in response to a further amplified biasing current;

a second current amplifier coupled to the discharge means to provide the further amplified biasing current;

a first current amplifier coupled to the second current amplifier to provide an amplified biasing current to the second current amplifier in response to a biasing current at an input of the first current amplifier;

means for biasing the second current amplifier in response to an input signal, even when a voltage at the capacitive output load falls below a reference value;

wherein the means for the second current amplifier includes means for coupling the biasing current to the input of the first current amplifier to amplify the biasing current and to provide the amplified biasing current to the input of the second current amplifier when the voltage at the capacitive output load is above the reference value and means for bypassing the first current amplifier to provide the biasing current to the second current amplifier when the voltage at the capacitive output load is below the reference value;

wherein the biasing current is provided by a bias current source, the first current amplifier comprises a first transistor having a base terminal coupled to the bias current source and having emitter and collector terminals, and a first resistor coupled between the base and emitter terminals of the first transistor, the emitter terminal of the first transistor being coupled to the second current amplifier, and the means for bypassing comprises a second transistor having a base terminal coupled to the bias current source, an emitter terminal coupled to the collector terminal of the first transistor and a collector terminal coupled to the second current amplifier.

16. The apparatus in accordance with claim 15, wherein the means for providing the biasing current to the first current amplifier comprises an input buffer responsive to the input signal, the input buffer comprising a third transistor coupled to be biased by the input signal and having a collector terminal, a second resistor coupled to the collector terminal of the third transistor, and a fourth transistor having a base terminal coupled To the second resistor and a collector terminal coupled to the base terminal of a fifth transistor, which comprises the second current amplifier.

17. Apparatus for receiving a bias signal and for providing a controlled biasing signal for driving an output load having a load signal, the biasing signal dependent upon the load signal of the output load, the load signal being variable across a predetermined reference value, the apparatus comprising:

a switch coupled between the output load and the input of the first signal amplifier and controllable between a first state and a second state, the switch being in the first state upon the load signal being below the reference value and in the second state upon the load signal being above the reference value;

a first signal amplifier having an input for receiving the bias signal and an output, the first signal amplifier being coupled to the switch such that the first amplifier is shunted between its input and output by the switch upon the switch being in the first state;

a second signal amplifier having an input coupled to the output of the first amplifier, the second signal amplifier having an output for providing the controlled biasing signal; and discharge means coupled between the output of the second signal amplifier and the output load to discharge the output load in response to the controlled biasing signal.

18. The apparatus as recited in claim 17, further comprising a comparator operable with a reference signal, the reference signal being proportional to the reference value, the comparator having a signal input for receiving the load signal and a signal output for providing a switch control signal dependent upon the relation between the reference signal and the load signal, wherein the state of the switch is dependent upon the switch control signal.

19. The apparatus as recited in claim 17, wherein the first signal amplifier has a bias port, further comprising a diode for coupling the load signal to the bias port of the first amplifier.

20. The apparatus as recited in claim 19, wherein the second signal amplifier has a bias port, wherein the diode is coupled to the bias port of the second signal amplifier.

21. The apparatus as recited in claim 20, wherein the first and second amplifiers comprise first and second transistors, respectively, coupled in a Darlington amplifier configuration, wherein the switch is coupled between the bias port of the first transistor and the bias port of the second transistor.

22. Apparatus for receiving a bias signal and for providing a controlled biasing signal to a biased device having an input and an output, the controlled biasing signal derived from the bias signal and dependent upon a load signal produced by a load having a port, the load signal being available at the port of the load, the load signal being variable across a predetermined reference value, wherein the output of the biased device is coupled to the port of the load, the apparatus comprising:

a switch circuit coupled between the load and the input of the first signal amplifier and controllable between a first state and a second state, the switch circuit being in the first state upon the load signal being below the reference value and in the second state upon the load signal being above the reference value;

a first signal amplifier having an input for receiving the bias signal and an output, the first signal amplifier being coupled to the switch such that the first amplifier is bypassed by the switch upon the switch being in the first state;

a second signal amplifier having an input coupled to the output of the first signal amplifier, the second signal amplifier having an output for coupling the controlled biasing signal to the biased device input.

23. The apparatus as recited in claim 22, further comprising a comparator operable with a reference signal proportional to the reference value, the comparator having a signal input for receiving the load signal and a signal output for providing a switch control signal to the switch dependent upon the relation between the reference signal and the load signal, wherein the state of the switch is dependent upon the switch control signal.

24. The apparatus as recited in claim 22, wherein the first and second amplifiers comprise first and second transistors, respectively, coupled in a Darlington amplifier configuration.

25. The apparatus as recited in claim 24, wherein the switch circuit is coupled between the input of the first transistor and the input of the second transistor.

26. The apparatus as recited in claim 24, wherein the switch is coupled between the collector of the first transistor and the collector of the second transistor, and wherein the base of the first transistor is coupled to the base of the second transistor.

27. The apparatus as recited in claim 26, further comprising a diode for coupling the load signal to the collector of the second transistor and to the collector of the first transistor.

28. The apparatus as recited in claim 27, wherein the biased device is a third bipolar junction transistor having a base and a collector, wherein the base of the third transistor is coupled to the emitter of the second transistor, and the collector of the third transistor is coupled to the port of the load to provide feedback from the biased device to the switch.

29. A method for receiving a bias signal and for providing a controlled biasing signal to drive a load, the biasing signal dependent upon an output signal of the load, the output signal being variable across a predetermined reference value, the method comprising the steps of;

controlling a switch to switch between first and second switch states depending upon the value of the output signal with respect to the predetermined reference value;

amplifying the bias signal with first and second series connected amplifiers in response to the switch being in the first state, wherein the step of amplifying the bias signal with the first and second amplifiers comprises the step of coupling first and the second transistors in a Darlington configuration; and bypassing the first amplifier in response to the switch being in the second state so as to amplify the bias signal with the second amplifier, to the exclusion of the first amplifier upon the switch being in the second state.

30. The method as recited in claim 29, further comprising the step of coupling the output signal to a bias port of the first amplifier through a diode.

31. The method as recited in claim 30, further comprising the step of coupling the output signal to a bias port of the second amplifier through the diode.

32. A method as recited in claim 29, wherein the first and second transistors comprise a first and a second bipolar junction transistors, respectively.

33. A method for receiving a bias signal and for providing to a biased device a controlled biasing signal to drive a load having an output signal, the controlled biasing signal dependent upon the output signal of the load, the output signal being variable across a predetermined reference value, the method comprising the steps of:

coupling a load to the biased device;

controlling a switch to switch between first and second switch states depending on the value of the output signal with respect to the predetermined reference value;

amplifying the bias signal with the first and second series connected amplifiers in response to the switch being in the first state, wherein the step of amplifying the bias signal with the first and second amplifiers comprises the step of coupling first and second transistors in a Darlington configuration;

bypassing the first amplifier in response to the switch being in the second state so as to amplify the bias signal with the second amplifier, to the exclusion of the first amplifier upon the switch being in the second state.

coupling the biasing signal available at an output of the second amplifier to the biased device; and coupling the signal available at an output of the biased device to the load.

34. The method as recited in claim 33, wherein the first and second amplifiers and the biased device comprise a first, a second, and a third bipolar junction transistors, respectively, and wherein the step of coupling the amplified biasing signal from the output of the second amplifier comprises the step of biasing the base of the third transistor by coupling the emitter of the second transistor to the base of the third transistor.

35. The method as recited in claim 34, wherein the step of coupling the signal to the load comprises the step of coupling the collector of the third bipolar junction transistor to the load for providing feedback.

* * * * *